(12) United States Patent
Barwicz et al.

(10) Patent No.: US 10,012,798 B2
(45) Date of Patent: *Jul. 3, 2018

(54) SACRIFICIAL COUPLER FOR TESTING V-GROOVED INTEGRATED CIRCUITS

(71) Applicant: International Business Machines Corporation, Armonk, NY (US)

(72) Inventors: Tymon Barwicz, Yorktown Heights, NY (US); William M. J. Green, Irvington, NY (US); Marwan H. Khater, Astoria, NY (US); Jessie C. Rosenberg, Mount Vernon, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 50 days.

This patent is subject to a terminal disclaimer.

(21) Appl. No.: 15/198,061

(22) Filed: Jun. 30, 2016

(65) Prior Publication Data

US 2018/0003898 A1 Jan. 4, 2018

(51) Int. Cl.
G02B 6/30 (2006.01)
G02B 6/136 (2006.01)
(Continued)

(52) U.S. Cl.
CPC ............... *G02B 6/30* (2013.01); *G02B 6/12* (2013.01); *G02B 6/136* (2013.01); *G02B 6/305* (2013.01);
(Continued)

(58) Field of Classification Search
None
See application file for complete search history.

(56) References Cited

U.S. PATENT DOCUMENTS 4,085,501 A * 4/1978 Currie ................ B29D 11/0073
219/121.12
4,828,358 A * 5/1989 Blonder ................ G01M 11/33
385/18

(Continued)

FOREIGN PATENT DOCUMENTS

GB 2387479 A * 10/2003
WO 2006028857 A2 3/2006

(Continued)

OTHER PUBLICATIONS

Kim, et al., "A 76-84-GHz 16-Element Phased-Array Receiver With a Chip-Level Built-In Self-Test System", IEEE Transactions on Microwave Theory and Techniques, vol. 61, No. 8, Aug. 2013, pp. 3083-3098.

(Continued)

*Primary Examiner* — Mike Stahl
(74) *Attorney, Agent, or Firm* — Cantor Colburn LLP; Vazken Alexanian

(57) ABSTRACT

Embodiments are directed to a method of forming an optical coupler system. The method includes forming at least one waveguide over a substrate, and forming gratings in a first region over the substrate. The method further includes configuring the gratings to couple optical signals to or from the at least one waveguide, and forming a v-groove in the first region over the substrate, wherein forming the v-groove includes removing the gratings from the first region.

24 Claims, 10 Drawing Sheets

(51) Int. Cl.
  *G02B 6/34* (2006.01)
  *H01L 21/66* (2006.01)
  *G02B 6/12* (2006.01)
  *G02B 6/124* (2006.01)
  *G02B 6/122* (2006.01)

(52) U.S. Cl.
  CPC ............... *G02B 6/34* (2013.01); *H01L 22/32* (2013.01); *G02B 6/124* (2013.01); *G02B 6/1228* (2013.01)

(56) References Cited

U.S. PATENT DOCUMENTS

| | | | | |
|---|---|---|---|---|
| 5,557,695 | A * | 9/1996 | Yamane | G02B 6/30 385/147 |
| 5,787,214 | A | 7/1998 | Harpin et al. | |
| 9,459,177 | B1 * | 10/2016 | Dong | G01M 11/30 |
| 2003/0123793 | A1 * | 7/2003 | Johannessen | G02B 6/12 385/36 |
| 2004/0033633 | A1 * | 2/2004 | Yang | G01M 11/00 438/14 |
| 2008/0068039 | A1 | 3/2008 | Bernstein et al. | |
| 2009/0046978 | A1 * | 2/2009 | Yasuda | G02B 6/1221 385/31 |
| 2009/0290837 | A1 | 11/2009 | Chen et al. | |
| 2011/0274393 | A1 * | 11/2011 | Reed | G02B 6/12007 385/37 |
| 2012/0104389 | A1 * | 5/2012 | Whitbread | G01M 11/00 257/48 |
| 2014/0043050 | A1 | 2/2014 | Stone et al. | |
| 2014/0111793 | A1 * | 4/2014 | Asghari | G01J 1/0425 356/73 |
| 2014/0193115 | A1 | 7/2014 | Popovic | |
| 2015/0214122 | A1 * | 7/2015 | Vermeulen | G01M 11/30 438/14 |
| 2015/0262706 | A1 | 9/2015 | Curley et al. | |
| 2015/0285996 | A1 | 10/2015 | Selvaraja | |
| 2015/0295675 | A1 * | 10/2015 | Sugama | G02B 6/42 398/65 |
| 2017/0082799 | A1 * | 3/2017 | Novack | G02B 6/124 |

FOREIGN PATENT DOCUMENTS

| | | |
|---|---|---|
| WO | 2014025824 A3 | 2/2014 |
| WO | 2014089520 A1 | 6/2014 |

OTHER PUBLICATIONS

List of IBM Patents or Patent Applications Treated as Related; Date Filed: Jun. 30, 2016, p. 1-2.
Roelkens et al., "High efficiency Silicon-on-Insulator grating coupler based on a poly-Silicon overlay." Nov. 27, 2006 / vol. 14, No. 241 Optics Express. (9 pgs).
Tymon Barwicz, et al., "Sacrificial Grating Coupler for Testing V-Grooved Integrated Circuits", U.S. Appl. No. 15/198,053, filed Jun. 30, 2016.

* cited by examiner

SACRIFICIAL COUPLER FOR TESTING V-GROOVED INTEGRATED CIRCUITS

BACKGROUND

The present invention relates in general to the testing of optoelectronic components in integrated circuits (ICs) that utilize v-grooves to couple input/output (IO) photonic signals between optical fibers and the IC. More specifically, the present invention relates to fabrication methodologies and resulting structures that allow the efficient and cost-effective testing, including built-in-self-testing (BIST), of optoelectronic components in ICs prior to v-groove formation and coupling.

Semiconductor devices are used in many electronic and other applications. ICs are typically formed from various circuit configurations of semiconductor devices formed on semiconductor wafers. Alternatively, semiconductor devices can be formed as monolithic devices, e.g., discrete devices. Semiconductor devices are formed on semiconductor wafers by depositing many types of thin films of material over the semiconductor wafers, patterning the thin films of material, doping selective regions of the semiconductor wafers, etc. In a conventional semiconductor fabrication process, a large number of semiconductor devices are fabricated in a single wafer. After completion of device level and interconnect level fabrication processes, the semiconductor devices on the wafer are separated and the final products is packaged. CMOS (complementary metal-oxide semiconductor) is the semiconductor fabrication technology used in the transistors that are manufactured into most of today's computer microchips. In CMOS technology, both n-type and p-type transistors are used in a complementary way to form a current gate that forms an effective means of electrical control. Processing steps performed later in CMOS technology are referred to as back-end-of-line (BEOL) CMOS processing, and processing steps performed early in CMOS technology are referred to as front-end-of-line (FEOL) CMOS processing.

Interconnect bottlenecks are mitigated, and in many cases overcome, by replacing selected IC electrical signals and metallic connections on ICs with optical signals and optical couplers. The optical IC signals, once coupled from optical fibers to the IC, are routed to target downstream optoelectronic components, as well as output optical fibers. ICs often use v-grooves for edge-coupling to optical fibers in the final packaged product. However, the optical access required for testing ICs that use v-groove coupling is only available after v-groove etching, dicing and packaging, which are expensive and time-consuming processes. For example, if a v-groove coupled IC includes a silicon photonic transceiver having a transmitter and a receiver, in order to test the transceiver, the transmitter and the receiver must be connected together. And, if built-in-test (BIST) functionality for the silicon photonic transceiver will be included in the final IC package, a connection between the transmitter and the receiver on the same or neighboring chips is also required in order to fully test the BIST functionality prior to final packaging. However, the necessary connections for testing BIST functionality cannot be accomplished until BEOL groove etching, dicing and packaging processes are completed. These BEOL processes are expensive and time-consuming. Accordingly, the testing of v-groove coupled ICs is often performed on separate test ICs having inputs and outputs connected using optical couplers that do not require expensive and time-consuming fabrication. Such testing approaches and configurations provide some information but do not allow testing of the actual IC product.

It is therefore desirable to test the performance of actual v-groove coupled IC products at the wafer-level before v-groove etching, dicing and packaging in order to acquire statistical yield and performance data and package only known-good dies.

SUMMARY

Embodiments are directed to a method of forming an optical coupler system. The method including forming a first optoelectronic component over a substrate, forming a sacrificial optical coupler in a first region over the substrate, configuring the sacrificial optical coupler to couple optical signals to or from the first optoelectronic component and forming a v-groove in the first region over the substrate, wherein forming the v-groove includes removing the sacrificial optical coupler from the first region.

Embodiments are further directed to a method of forming an optical coupler system. The method includes forming a first optoelectronic component over a substrate, forming a second optoelectronic component over the substrate, forming a first sacrificial optical coupler in a first region over the substrate, configuring the first sacrificial optical coupler to couple optical signals to or from the first optoelectronic component, configuring the first sacrificial optical coupler to couple optical signals to or from the second optoelectronic component and forming a v-groove in the first region over the substrate, wherein forming the v-groove in the first region includes removing the first sacrificial optical coupler from the first region.

Embodiments are further directed to a method of forming an optical coupler system. The method includes forming a transmitter component over a substrate, forming a receiver component over the substrate, forming a first sacrificial optical coupler in a first region over the substrate, configuring the first sacrificial optical coupler to couple optical signals to or from the transmitter component, configuring the first sacrificial optical coupler to couple optical signals to or from the receiver component and forming a v-groove in the first region over the substrate, wherein forming the v-groove in the first region includes removing the first sacrificial optical coupler from the first region.

Embodiments are further directed to an optical coupler system. The optical coupler system includes a first optoelectronic component formed over a substrate and a sacrificial optical coupler formed in a first region over the substrate, wherein the sacrificial optical coupler is configured to couple optical signals to or from the first optoelectronic component, and wherein the first region defines an area in which a v-groove will be formed during a subsequent fabrication operation of the optical coupler system.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

Figure 1:
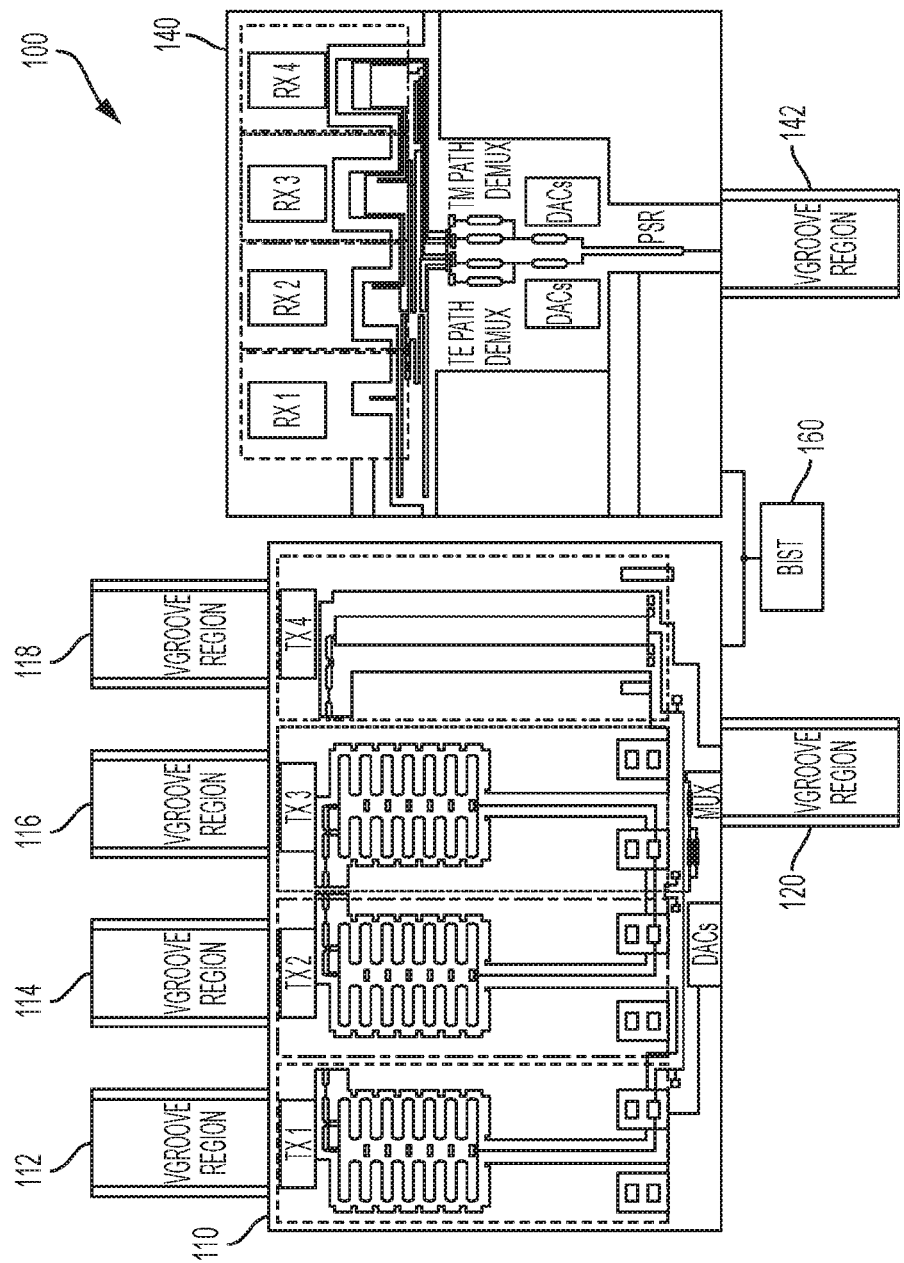
FIG. 1 depicts a top-down view of an optical coupler and testing system after an initial fabrication stage according to one or more embodiments.

In the accompanying figures and following detailed description of the described embodiments, the various elements illustrated in the figures are provided with three or four digit reference numbers.

DETAILED DESCRIPTION

It is understood in advance that, although descriptions of the present invention provided herein include a detailed description of a silicon photonic transceiver having a transmitter in one chip region and a receiver in another chip region of the same or a neighboring chip, implementation of the teachings recited herein are not limited to a particular optoelectronic component, chip configuration or transmission architecture. Rather embodiments of the present invention are capable of being implemented in conjunction with any other type of optoelectronic component, transmission architecture or operating environment now known or later developed. Additionally, although one or more embodiments of the present invention focus on sacrificial optical couplers formed from waveguides and gratings, the teachings of the present invention can be implemented in connection with other types of sacrificial optical couplers as long as the sacrificial optical coupler can be at least substantially removed by the v-groove formation process.

Various embodiments of the present invention will now be described with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection." The term "optoelectronic" is used herein to capture the property of receiving, processing, transporting and/or transmitting signals in the form of photonic energy.

As previously noted herein, interconnect bottlenecks are mitigated, and in many cases overcome, by replacing selected IO electrical signals and metallic connections on ICs with optical signals and optical couplers. The optical IO signals, once coupled from optical fibers to the IC, are routed to target downstream optoelectronic components, as well as output optical fibers. Silicon photonic chips often use v-grooves for edge-coupling and packaging to optical fibers. However, v-grooves only provide optical access to the IC chip after v-groove etching, dicing and packaging, which are expensive and time-consuming processes. For example, in order to fully test the transmitter and receiver portions of a silicon photonic transceiver, the transmitter and receiver must be connected together off-chip via fiber, or else both must be tested separately. Currently, wafer-level testing can only be performed on separate test chips, wherein the test chip inputs and outputs are connected to vertical grating couplers. Accordingly, for photonic ICs that rely on v-groove coupling, known wafer-level testing methodologies do not allow testing of the actual product chip prior to v-groove formation in the final fabrication and packaging stages.

It is therefore desirable to test the performance of optoelectronic components such as a silicon photonic transceiver on the wafer-level before v-groove etching, dicing and packaging in order to acquire statistical yield and performance data and package only known-good dies. Additionally, in situations where full BIST functionality is provided to the silicon photonic transceiver, testing the BIST circuit requires the transmission of optical signals between the transmitter and the receiver, which typically cannot be done through v-grooves before v-groove etching, dicing and packaging.

Turning now to an overview of the present invention, one or more embodiments allow the testing of optoelectronic components in ICs that utilize v-grooves to couple IO photonic signals between optical fibers and the IC. More specifically, one or more embodiments of the present invention provide fabrication methodologies and resulting structures that allow the efficient and cost-effective pre-BEOL testing, including BIST, of optoelectronic components in ICs prior to v-groove formation and coupling. In one or more embodiments, sacrificial optical couplers (e.g., sacrificial waveguides and sacrificial grating couplers) are placed, prior to actual v-groove formation in the v-groove regions (i.e., the regions where the v-groove will be formed) and/or kerf regions (i.e., the dicing lanes and regions in between the product chips in which test structures and monitoring structures are formed) and connected to multiple on-chip components. In one or more embodiments, the multiple on-chip components include silicon photonic transceivers having transmitters and receivers placed on the same or neighboring chips, along with separate output v-grooves that and are not connected on the chip.

Known approaches to forming temporary on-chip connection between two components (e.g., a transmitter and a receiver) for wafer-scale testing and BIST create additional insertion loss and power consumption through the use of taps and/or optical switches to couple the temporary connection into the same waveguide output as the v-groove that will be formed in the final packaging steps. In contrast to such known approaches, in one or more embodiments the sacrificial optical coupler couples the same optical signals into the IC that will be provided by the v-groove coupler, which allows full testing of the product prior to the completion of final packaging processes. However, because the sacrificial optical coupler is formed prior to v-groove formation and coupling, the full functionality of the actual to-be-packaged IC (including any BIST circuitry) can be tested prior to v-groove etching, dicing and packaging, which are expensive and time-consuming processes. Additionally, because the sacrificial optical coupler is located over the region in which the v-groove and/or the kerf will be formed, the sacrificial optical coupler is completely removed during v-groove etching, dicing and packaging. Thus, the presence of the sacrificial optical coupler for inline wafer-scale testing does not negatively impact the final product performance, and the exact product chip can be fully tested prior to final assembly. In contrast to known IC inline testing techniques that rely on taps or switching elements to route or split optical signals for testing, the described sacrificial optical coupler avoids the excess optical insertion loss and power consumption of taps and switches. There are two primary aspects of the optical insertion loss. First, excess loss from the structures can deteriorate the product device permanently even after the taps and switches are no longer in use. Second, only a small amount of power can often be coupled to the device under test. However, by utilizing a sacrificial coupler in accordance with the present teachings, the device receives substantially the same amount of light that will be incident on the IC optical path in the final packaged product, thereby coupling, during testing, the same (or greater) power levels as would be present during operation.

Figure 3:
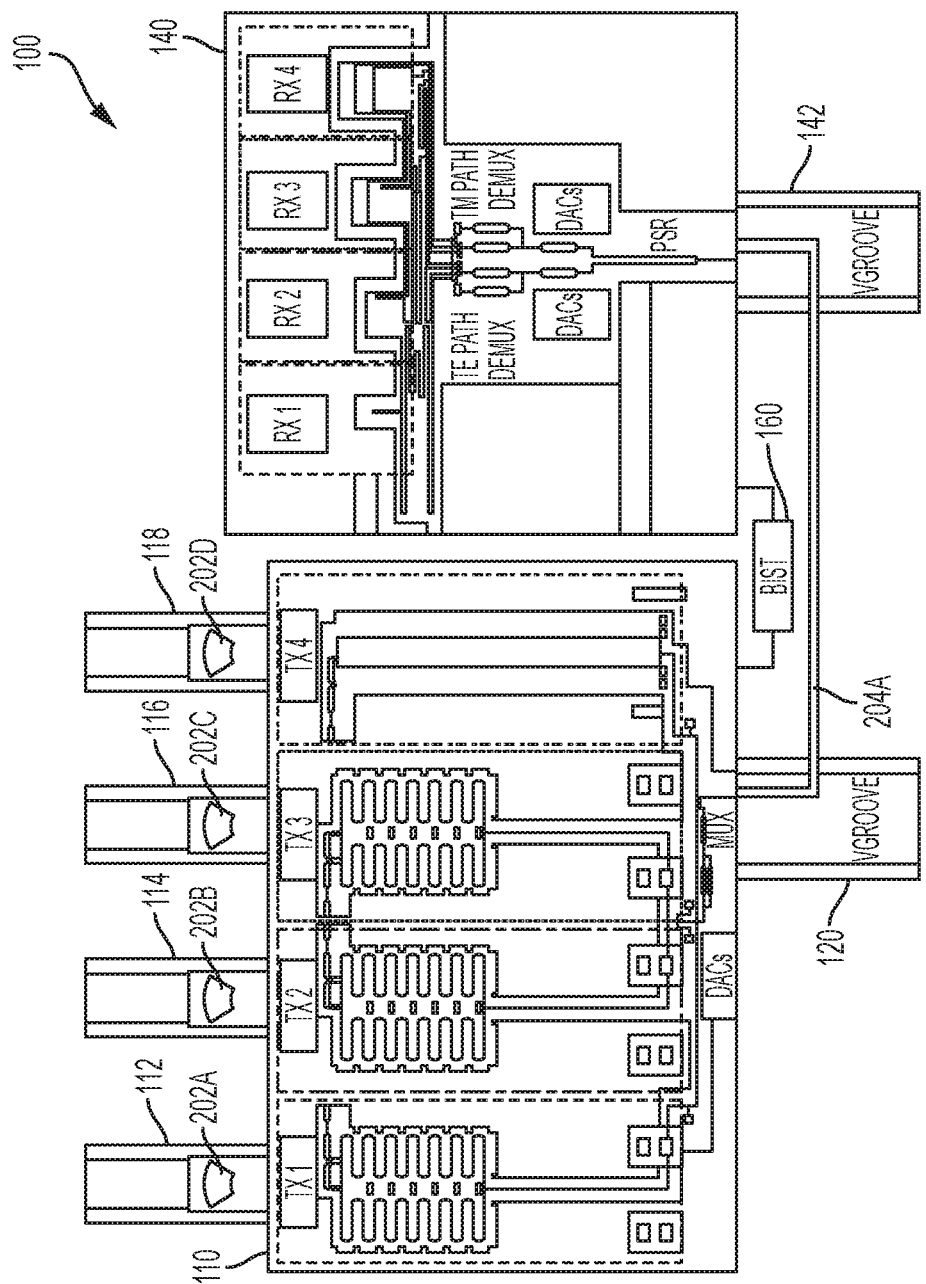
FIG. 3 depicts a top-down view of an optical coupler and testing system after sacrificial optical coupler formation according to one or more embodiments.

Turning now to a more detailed description of the present invention, FIG. 1 and FIG. 3, taken together, depict top-down views of an optical coupler and testing system 100 after initial fabrication stages according to one or more embodiments. In practice, the fabrication operations that are used to create the structure depicted in FIG. 3 are incorporated within and occur at substantially the same time as the fabrication operations that are used to create to the structure depicted in FIG. 1. To facilitate explanation and illustration of the disclose feature of forming the sacrificial grating couplers (202A, 202B, 202C, 202D) in the regions (112, 114, 116, 118, shown in FIG. 1) where v-grooves will be formed during BEOL processing, the formation of the sacrificial grating couplers (202A, 202B, 202C, 202D) is depicted separately in FIG. 3. However, in practice, the fabrication operations that are used to create the sacrificial grating couplers (202A, 202B, 202C, 202D) depicted in FIG. 3 are incorporated within and occur at substantially the same time as the fabrication operations that are used to create to the structure depicted in FIG. 1.

Figure 2:
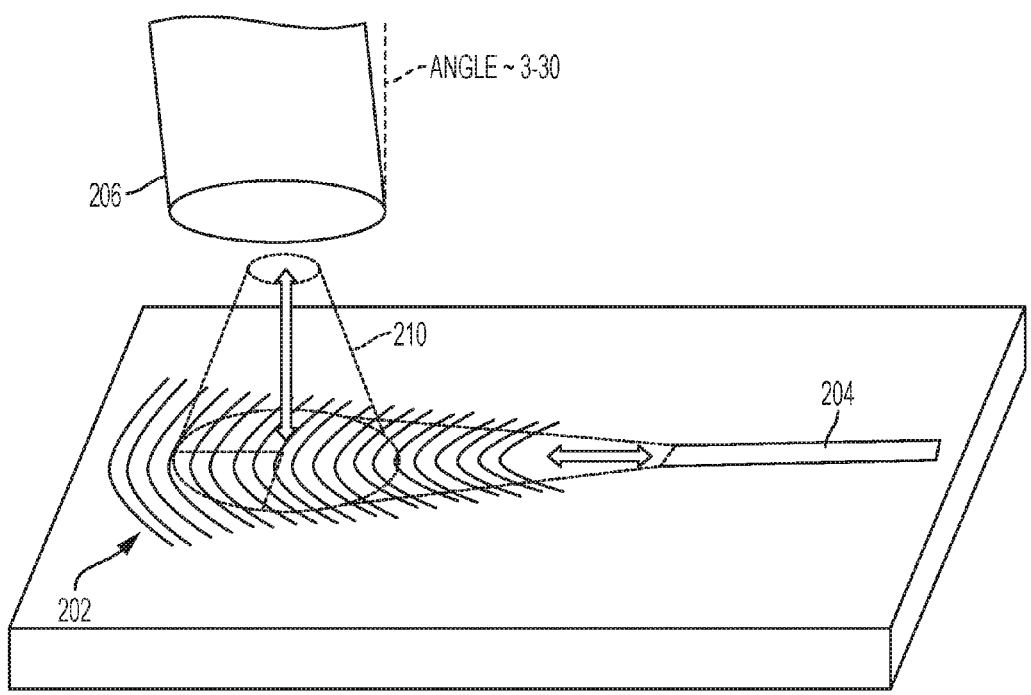
FIG. 2 depicts a three-dimensional view of an optical grating coupler and a waveguide coupler, which can be utilized as sacrificial optical couplers according to one or more embodiments.

Although the embodiment shown in FIG. 1 and FIG. 2 focuses on an application of the present invention to a silicon photonic transceiver having a transmitter in one chip region and a receiver in another chip region of the same or a neighboring chip, implementation of the teachings recited herein are not limited to a particular type of optoelectronic component or transmission architecture. Rather embodiments of the present invention are capable of being implemented in conjunction with any other type of optoelectronic component, transmission architecture or operating environment now known or later developed. Additionally, although embodiments of the present invention focus sacrificial optical couplers formed from waveguides and optical grating couplers, the teachings of the present invention can be implemented in connection with other sacrificial optical couplers as the long as the sacrificial optical coupler can be coupled into the same waveguide as the end-product v-groove, and as long as the sacrificial optical coupler is removed during formation of the end-product v-groove.

As shown in FIG. 1, system 100 includes transmitters TX1, TX2, TX3, TX4 coupled through a variety of optical pathways and circuit components (e.g., controllers, digital/analog converters (DACs), multiplexers (MUX), polarization splitters and rotators (PSRs), BIST circuitry, etc.) to receivers RX1, RX2, RX3, RX4. In the embodiment shown in FIG. 1, transmitters TX1, TX2, TX3, TX4 are in a first chip region 110 and receivers RX1, RX2, RX3, RX4 are in a second chip region 140. First and second chip regions 110, 140 can be on the same or neighboring chips. For ease of illustration, BIST circuitry 160 is represented in FIG. 1 as a single block. However, it should be understood that BIST circuitry 160 will in practice involve various circuit components distributed across first and second chip regions 110, 140. At this stage of fabrication, complete components have been fabricated on chip regions 110, 140 but v-grooves have not yet been formed. The regions in which v-grooves will be formed in the final fabrication and packaging stages are shown as v-groove regions 112, 114, 116, 118, 120, 142.

Figure 7:
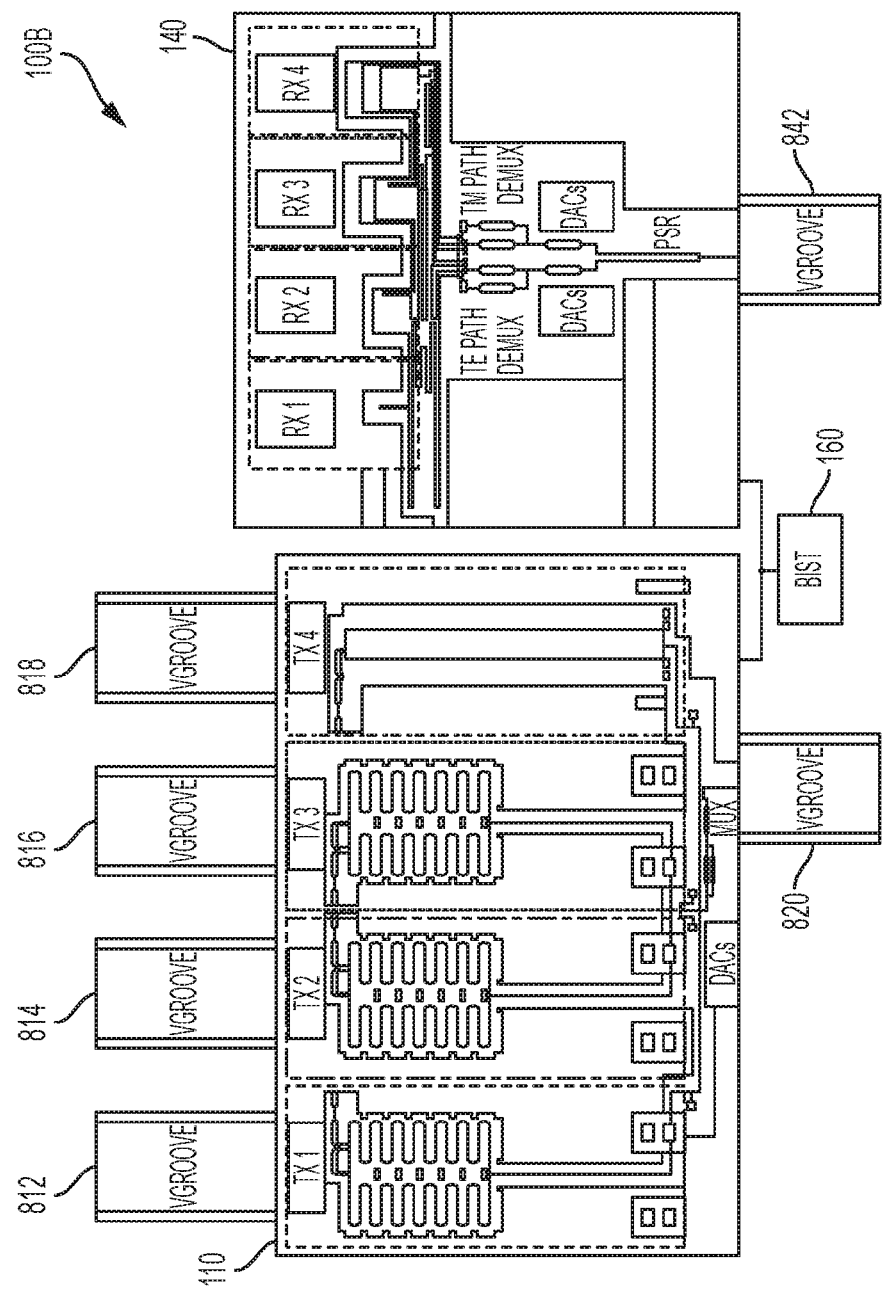
FIG. 7 depicts a top-down view of an optical coupler and testing system after sacrificial optical coupler removal and v-groove formation according to one or more embodiments.
Figure 8A:
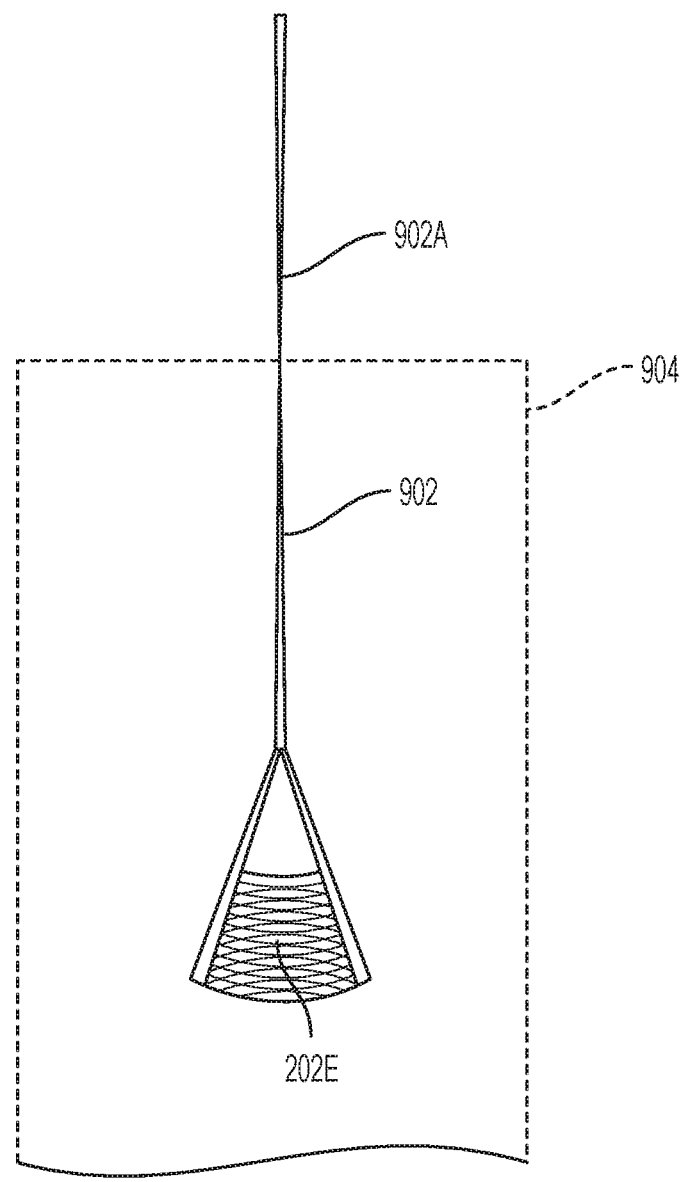
FIG. 8A depicts a top-down view of a sacrificial grating coupler and a mode converter in a v-groove region according to one or more embodiments.
Figure 8B:
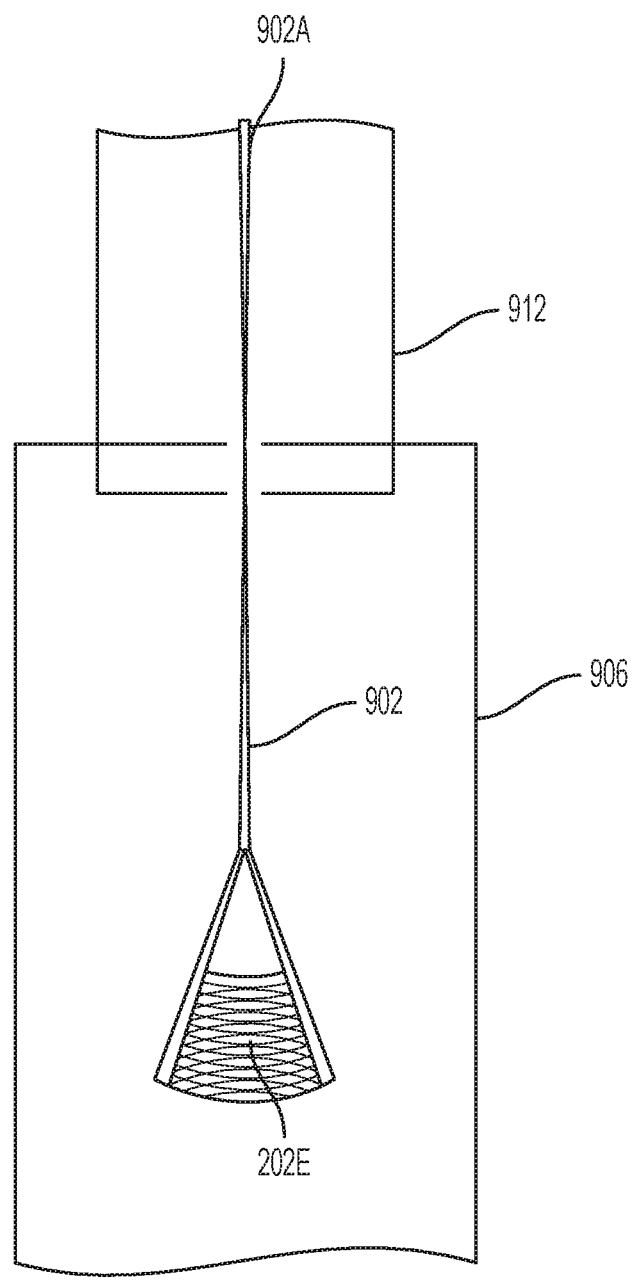
FIG. 8B depicts a top-down view of a sacrificial grating coupler over-laid on patterning to form a v-groove according to one or more embodiments.
Figure 8C:
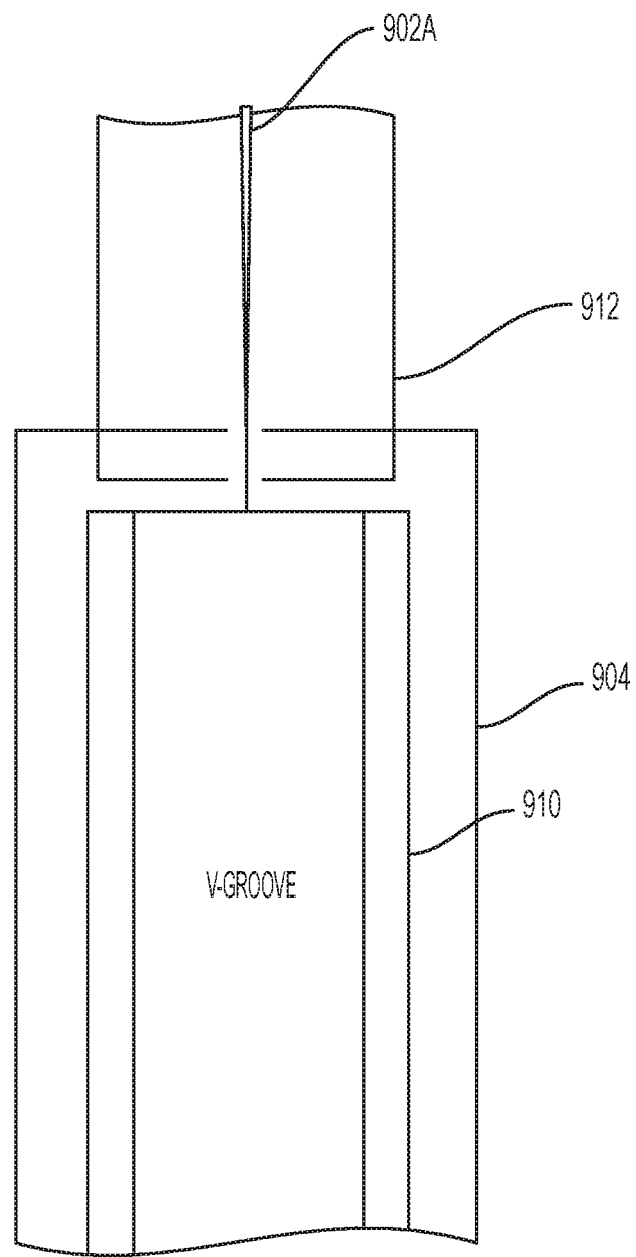
FIG. 8C depicts a top-down view of a v-groove after removal of the sacrificial grating coupler during v-groove formation according to one or more embodiments.

Each transmitter TX1, TX2, TX3, TX4 transmits at a different wavelength, and the transmitter signals are ultimately combined into a single path that is coupled through a v-groove coupler 820 (shown in FIG. 7) to a single optical fiber 912 (shown in FIG. 8C). Optical fiber 910 then couples the transmitted signals through a v-groove input 842 (shown in FIG. 7) on second chip region 140 into an optical path that de-multiplexes the transmitted signals using standard components (e.g., controllers, DACs, polarization splitters and rotators (PSRs) splitting the transverse electric (TE) signals from the transverse magnetic (TM) signals and rotating the TM signals into TE, wavelength division multiplexers (MUX), wavelength division de-multiplexers (DEMUX) BIST circuitry, etc.) to receivers RX1, RX2, RX3, RX4. It is noted that any aspect of this description that references communications between one transmitter and one receiver of system 100 applies equally to any transmitter and receiver of system 100.

In order to test system 100 prior to final v-groove formation, sacrificial optical couplers are formed in v-groove regions 112, 114, 116, 118, 120, 142 in accordance with one or more embodiments of the present invention. FIG. 2 depicts an exemplary optical grating coupler 202 and an exemplary waveguide coupler 204, which can be utilized as sacrificial optical couplers in system 100 according to one or more embodiments. In general, grating couplers can be used to couple optical signals from an optical fiber 206 to a waveguide 204, or from waveguide 204 to optical fiber 206. Grating coupler 202 bridges the large mismatch in optical spot size between optical fiber 206 and waveguide 204. Grating couplers are a more flexible approach than edge coupling in that grating couplers allow coupling anywhere on a chip, and no post-processing is needed for coupling, which facilitates wafer-scale testing prior to packaging. However, grating couplers have limited optical bandwidth and larger polarization penalty than in-plane couplers, so, following the teachings of the present invention, grating couplers are used as sacrificial grating couplers that are replaced with V-grooves and/or in-plane couplers in the end-product device packaging. Any type of grating is suitable as long as the gratings provide a designed periodic variation of the refractive index on-chip as known to those skilled in the art. Suitable types of vertical grating couplers include fully etched silicon grating formed in the SOI (silicon-on-insulator) layer, partially etched silicon grating formed in the SOI layer, fully etched poly-silicon grating formed in the CMOS poly-silicon gate layer, fully etched silicon nitride grating, and the like.

Waveguide 204 acts as "light pipe" that confines and guides light in the plane of the wafer. In general, optical waveguides are dielectric structures that transmit various forms of radiation or electromagnetic waves in a direction that is parallel (i.e., transverse) to the waveguide's propagation axis. Optical waveguides are fundamental building blocks of many optical systems, including fiber-optic communications links, fiber lasers and amplifiers for high-power applications, as well as all-optical photonic ICs. Optical waveguides can be classified according to their geometry (e.g., planar, slab/strip, fiber waveguides, etc.), mode structure (e.g., single-mode, multi-mode, etc.), refractive index distribution (e.g., step, gradient, etc.), guiding mechanism (e.g., total internal reflection, anti-guiding, photonic bandgap, etc.) and waveguide material (e.g., glass, polymer, semiconductor, etc.).

Because multi-mode optical waveguides support the transmission of multiple distinct signals, their transverse dimension can be large, and this makes them well suited for short distance optical applications. Thus, multi-mode optical waveguides are suited for implementing short distance optical coupling. However, it is difficult to perform higher level optical signal processing (e.g., wavelength division multiplexing) using multi-mode optical signals. Further, their large transverse dimension makes it difficult to interface multi-mode optical waveguides to the single-mode optical fibers that are typically used to communicate over longer distances. Accordingly, single-mode optical waveguides are better suited for longer distance coupling because they interface effectively with single-mode, long distance optical fibers. Additionally, single-mode optical waveguides are compatible with the performance of higher level optical signal processing.

FIG. 3 depicts optical coupler and testing system 100 with further detail showing the sacrificial grating couplers 202A, 202B, 202C, 202D over v-groove regions 112, 114, 116, 118, and showing a sacrificial waveguide 204A over v-groove regions 120, 142 according to one or more embodiments. Additional details of the formation of sacrificial grating couplers 202A, 202B, 202C, 202D over v-groove regions 112, 114, 116, 118 are shown in FIGS. 8A, 8B and 8C. Referring now to FIGS. 3 and 8A, sacrificial grating couplers 202A, 202B, 202C, 202D couple light from a light source such as a laser (not shown) through a mode converter 902 (which can be a waveguide) into transmitters TX1, TX2, TX3, TX4. Sacrificial grating couplers 202, 202A, 202B, 202C, 202D can be formed using conventional vertical grating fabrication techniques known in the art. The placement of sacrificial grating couplers 202A, 202B, 202C, 202D, however, is made in accordance with embodiments of the present invention over v-groove regions 112, 114, 116, 118. Similarly, sacrificial waveguide 204A couples light from a MUX output of TX1, TX2, TX3, TX4 to PSR and DEMUX inputs to receivers RX1, RX2, RX3, RX4. Sacrificial waveguides 204, 204A can be formed using conventional waveguide fabrication techniques known in the art. The placement of sacrificial waveguide 204A, however, is made in accordance with embodiments of the present invention over v-groove regions 120, 142. In accordance with embodiments of the present invention, sacrificial waveguide 204A and sacrificial grating couplers 202A, 202B, 202C, 202D allow optical signals to be coupled into transmitters TX1, TX2, TX3, TX4 through optical paths of first chip region 110, sacrificial waveguide 204A and optical paths of second chip region 140, and then into receivers RX1, RX2, RX3, RX4, in substantially the same manner as the v-groove coupling that will be present in the final packaged product.

Because sacrificial grating couplers 202A, 202B, 202C, 202D and sacrificial waveguide 204A are formed prior to v-groove formation and coupling, the full functionality of the actual to-be-packaged IC (including any BIST circuitry 160) can be tested prior to v-groove etching, dicing and packaging, which are expensive and time-consuming processes. Because sacrificial grating couplers 202A, 202B, 202C, 202D and sacrificial waveguide 204A are located over the regions (112, 114, 116, 118, 120, 142) in which the v-grooves will be formed, sacrificial grating couplers 202A, 202B, 202C, 202D and sacrificial waveguide 204A are completely removed during v-groove etching, dicing and packaging. Thus, the presence of sacrificial grating couplers 202A, 202B, 202C, 202D and sacrificial waveguide 204A for inline wafer-scale testing does not negatively impact the final product performance, and the exact product chip can be fully tested prior to final assembly. In contrast to known IC inline testing techniques that rely on taps or switching elements to route or split optical signals for testing, the described sacrificial grating couplers 202A, 202B, 202C, 202D and sacrificial waveguide 204A avoid the excess optical insertion loss and power consumption of taps and switches, and instead avoid the permanent performance impact on the final product and receive substantially the same amount of light as the amount that of light will be incident on the IC optical path in the final packaged product, thereby coupling the same power levels (or greater) during testing that would be present during operation.

Figure 4:
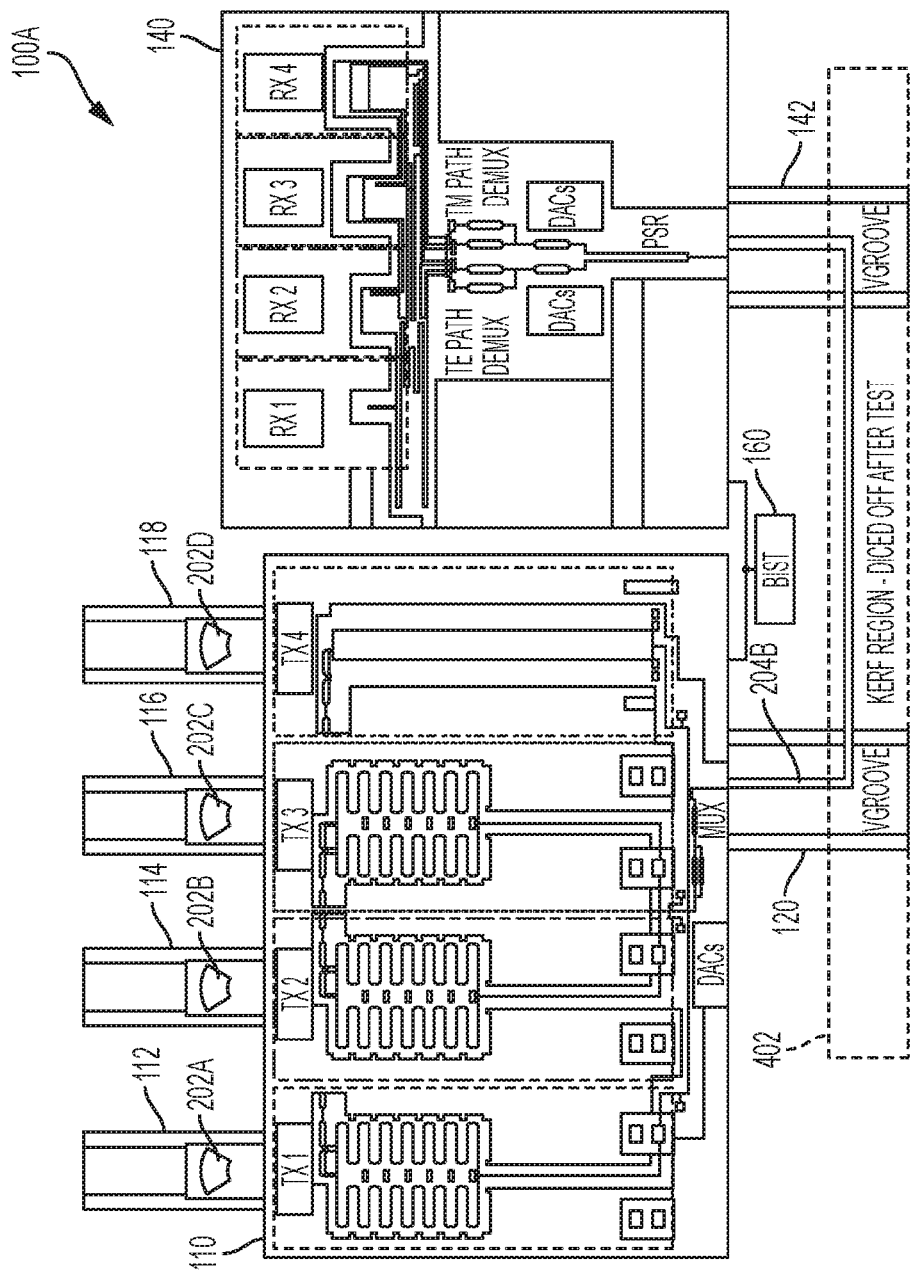
FIG. 4 depicts a top-down view of an optical coupler and testing system after sacrificial optical coupler formation according to one or more embodiments.

FIG. 4 depicts an optical coupler and testing system 100A after sacrificial optical coupler formation according to one or more embodiments. System 100A shown in FIG. 4 identical to system 100 shown in FIG. 3 except a sacrificial waveguide 204B is located such that it extends through v-groove regions 120, 142, as well as through a kerf region 402. To eliminate the potential for the described sacrificial waveguide to disrupt the v-groove etch, sacrificial waveguide 204B can be extended into kerf region 402. In various semiconductor manufacturing processes, the semiconductor wafers that are produced have active regions (e.g., first and second chip regions 110, 140). These semiconductor wafers can be separated to produce individual IC chips. Chip separation processes can occur along or in kerf regions to separate the semiconductor wafer. Kerf regions can be located adjacent to and/or between the active regions. The kerf regions can include auxiliary structures. In one or more embodiments, the term "auxiliary structure" can refer to a structure formed during the processing of a semiconductor wafer that are not necessary for post fabrication functioning of the active structures of the processed semiconductor wafer (e.g., IC chips of the semiconductor wafer), and particularly can refer to structures that can be used to evaluate the manufacturing process of a semiconductor device. Examples of auxiliary structures can include, for example, process control monitor (PCM) devices, lithographic structures, metal pads, contacts for electrochemical etching, alignment structures and the like.

In accordance with embodiments of the present invention, sacrificial waveguide 204B is fully removed at the center of v-groove regions 120, 142. The end of sacrificial waveguide 204B will be diced off in kerf region 402, and therefore will not disrupt the edges of v-groove regions 120, 142 during v-groove fabrication. Electronic, photonic or optoelectronic components that are useful for testing but will not be required in the final packed product can also be placed in the optical path within the kerf region to aid with general testing and BIST functionality testing (e.g., PSR, MUX, deMUX, switches, power splitters, etc.).

Figure 5:
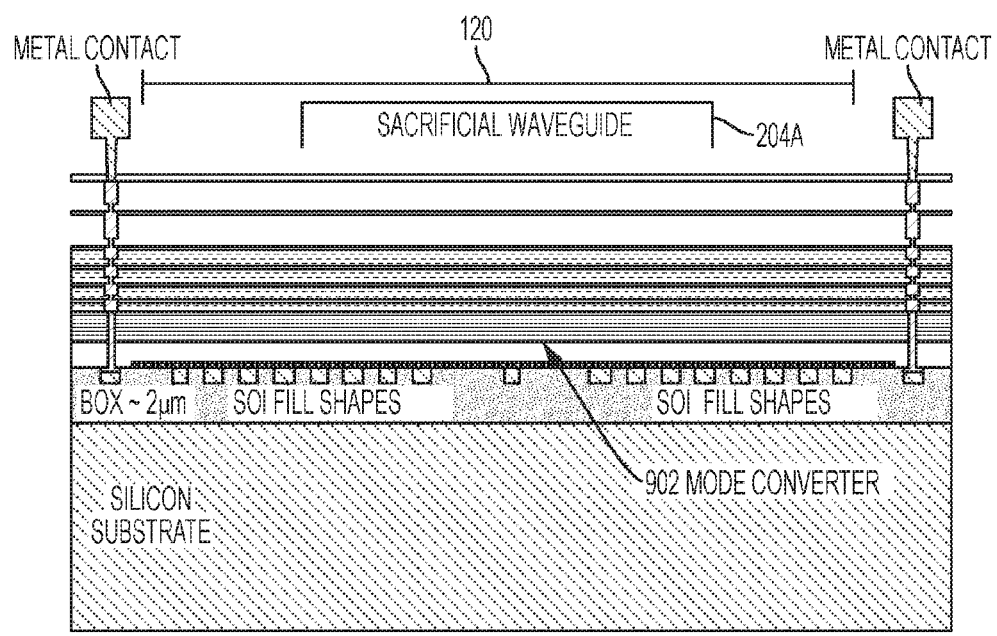
FIG. 5 depicts a cross-sectional view of an optical coupler and testing system prior to v-groove formation according to one or more embodiments.
Figure 6:
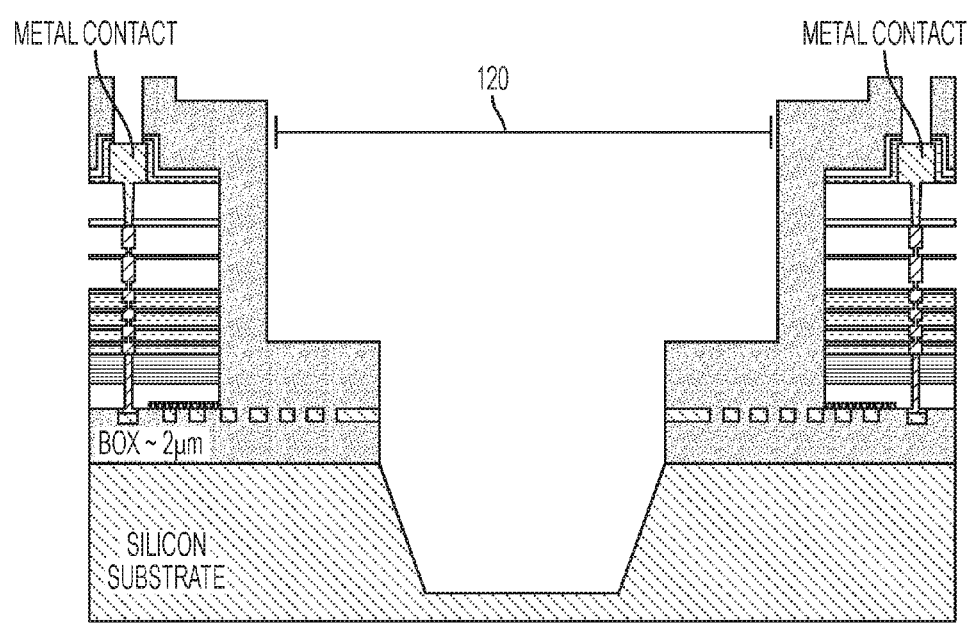
FIG. 6 depicts a cross-sectional view of an optical coupler and testing system after v-groove formation according to one or more embodiments.

A variety of known methodologies for forming v-grooves are capable of being utilized in connection with implementing one or more embodiments of the present invention. FIG. 5 depicts a cross-sectional view of a portion of first chip region 110 prior to v-groove formation, and FIG. 6 depicts a cross-sectional view of the same portion of first chip region 110 after v-groove formation. FIG. 7 depicts an optical coupler and testing system 100B after v-groove formation according to one or more embodiments, wherein sacrificial grating couplers 202A, 202B, 202C, 202D and sacrificial waveguides 204A, 204B have been removed by the fabrication methodology for forming v-grooves 812, 814, 816, 818, 820, 842 in v-groove regions 112, 114, 116, 118, 120, 102 (shown in FIGS. 1, 3 and 4).

FIG. 8A depicts a top-down view of sacrificial grating coupler 202E and mode converter 902 in a v-groove region 904 according to one or more embodiments. In one or more embodiments, two mode converters 902, 902A are used. Mode converter 902 is sacrificial and in the v-groove region 904. Mode converter 902A remains to convert the optical mode of a fiber 912 (shown in FIG. 8B and FIG. 8C) that is placed at packaging in the v-groove region 904 to a mode that can be easily routed on chip. The sacrificial mode converter 902 mimics the optical mode that will originate from fiber 912 at the end of the v-groove formation process and thus allows adequate transmission from the sacrificial grating coupler 202E to the device. FIG. 8B depicts a top-down view of an exemplary patterning operation for forming a v-groove with sacrificial grating coupler 202E superimposed over a v-groove pattern 906. FIG. 8C depicts a top-down view of a v-groove 910 after removal of sacrificial grating coupler 202E and mode converter 902, and after formation of v-groove 910 in v-groove region 904.

Thus it can be seen from the foregoing detailed description and accompanying illustrations, embodiments of the present invention allows for the efficient and cost-effective testing of photonic, optoelectronic components in ICs that utilize v-grooves to couple IO photonic signals between optical fibers and the IC. More specifically, embodiments of the present invention provides fabrication methodologies and resulting structures that allow for the efficient and cost-effective testing of photonic, optoelectronic components in ICs prior to v-groove formation and coupling.

As described in detail herein, a sacrificial optical coupler (e.g., a waveguide, a grating coupler, and the like) is formed over a region in which a v-groove will be formed. The sacrificial optical coupler couples the same optical signals into the IC that will be provided by the v-groove coupler, which allows full testing of the product prior to the completion of final packaging processes. Because the sacrificial optical coupler is formed prior to v-groove formation and coupling, the full functionality of the actual to-be-packaged IC (including any BIST circuitry) can be tested prior to v-groove etching, dicing and packaging, which are expensive and time-consuming processes. Because the sacrificial optical coupler is located over the regions in which the v-grooves and the kerfs will be formed, the sacrificial optical coupler is completely removed from the v-groove region during v-groove etching, dicing and packaging. Thus, the presence of the sacrificial optical coupler for inline wafer-scale testing does not negatively impact the final product performance, and the exact product chip can be fully tested prior to final assembly. In contrast to known IC inline testing techniques that rely on taps or switching elements to route or split optical signals, the described sacrificial optical coupler avoids the permanent performance impact on the final product and the excess optical insertion loss and power consumption of taps and switches, and instead receives substantially the same amount of light as the amount that will be incident on the IC optical path in the final packaged product, thereby coupling the same power levels (or greater) during testing that would be present during operation.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The corresponding structures, materials, acts, and equivalents of all means or step plus function elements in the claims below are intended to include any structure, material, or act for performing the function in combination with other claimed elements as specifically claimed. The present invention has been presented for purposes of illustration and description, but is not intended to be exhaustive or limited to the form described. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The flowchart and block diagrams in the figures illustrate the functionality and operation of possible implementations of systems and methods according to various embodiments of the present invention. In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. The actions can be performed in a differing order or actions can be added, deleted or modified. Also, the term "coupled" describes having a signal path between two elements and does not imply a direct connection between the elements with no intervening elements/connections therebetween. All of these variations are considered a part of the invention.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present invention has been described in detail in connection with only a limited number of embodiments, it should be readily understood that the present invention is not limited to such described embodiments. Rather, the present invention can be modified to incorporate any number of variations, alterations, substitutions or equivalent arrangements not heretofore described, but which are commensurate with the spirit and scope of the present invention. Additionally, while various embodiments of the present invention have been described, it is to be understood that aspects of the present invention can include only some of the described embodiments. Accordingly, the present invention is not to be seen as limited by the foregoing description, but is only limited by the scope of the appended claims.

What is claimed is:

1. A method of forming an optical coupler system, the method comprising:
   forming a first optoelectronic component over a substrate;
   forming a sacrificial optical coupler in a first region over the substrate;
   configuring the sacrificial optical coupler to couple optical signals to or from the first optoelectronic component; and
   forming a v-groove in the first region over the substrate;
   wherein forming the v-groove includes removing the sacrificial optical coupler from the first region.

2. The method of claim 1, wherein the sacrificial optical coupler comprises a sacrificial waveguide system.

3. The method of claim 1, wherein removing the sacrificial optical coupler from the first region comprises one or more etch operations.

4. The method of claim 1 further comprising performing a test operation comprising coupling optical signals through the sacrificial optical coupler to or from the first optoelectronic component.

5. The method of claim 1 further comprising:
   forming a second optoelectronic component over the substrate; and
   configuring the sacrificial optical coupler to couple optical signals to or from the second optoelectronic component.

6. The method of claim 5 further comprising performing a test operation comprising:
   coupling optical signals through the sacrificial optical coupler to or from the first optoelectronic component; and
   coupling optical signals through the sacrificial optical coupler to or from the second optoelectronic component.

7. The method of claim 5 further comprising:
   forming a built-in-self-test (BIST) circuit over the substrate;
   communicatively coupling the BIST circuit to the first optoelectronic component and the second optoelectronic component; and
   testing functionality of the BIST circuit by performing a test operation comprising coupling optical signals:
   through the sacrificial optical coupler;
   to or from the first optoelectronic component; and
   to or from the second optoelectronic component.

8. A method of forming an optical coupler system, the method comprising:
   forming a first optoelectronic component over a substrate;
   forming a second optoelectronic component over the substrate;
   forming a first sacrificial optical coupler in a first region over the substrate;
   configuring the first sacrificial optical coupler to couple optical signals to or from the first optoelectronic component;
   configuring the first sacrificial optical coupler to couple optical signals to or from the second optoelectronic component; and
   forming a v-groove in the first region over the substrate;
   wherein forming the v-groove in the first region includes removing the first sacrificial optical coupler from the first region.

9. The method of claim 8 further comprising:
   forming a second sacrificial optical coupler in a second region over the substrate;
   configuring the second sacrificial optical coupler to couple optical signals to or from the first optoelectronic component; and
   forming a v-groove in the second region over the substrate;
   wherein forming the v-groove in the second region includes removing the second sacrificial optical coupler from the second region.

10. The method of claim 9, wherein:
    the first sacrificial optical coupler comprises a sacrificial waveguide system; and
    the second sacrificial optical coupler comprises a sacrificial gratings system.

11. The method of claim 10, wherein:
    removing the first sacrificial optical coupler from the first region comprises one or more etch operations; and
    removing the second sacrificial optical coupler from the second region comprises one or more etch operations.

12. The method of claim 8 further comprising performing a test operation comprising:
    coupling optical signals through the first sacrificial optical coupler to or from the first optoelectronic component; and
    coupling optical signals through the first sacrificial optical coupler to or from the second optoelectronic component.

13. The method of claim 9 further comprising performing a test operation comprising:
    coupling optical signals through the second sacrificial optical coupler to or from the first optoelectronic component;
    coupling optical signals through the first sacrificial optical coupler to or from the first optoelectronic component; and
    coupling optical signals through the first sacrificial optical coupler to or from the second optoelectronic component.

14. The method of claim 8 further comprising:
forming a built-in-self-test (BIST) circuit over the substrate;
communicatively coupling the BIST circuit to the first optoelectronic component and the second optoelectronic component; and
testing functionality of the BIST circuit by performing a test operation comprising coupling optical signals:
through the first sacrificial optical coupler;
to or from the first optoelectronic component; and
to or from the second optoelectronic component.

15. The method of claim 9 further comprising:
forming a built-in-self-test (BIST) circuit over the substrate;
communicatively coupling the BIST circuit to the first optoelectronic component and the second optoelectronic component; and
testing functionality of the BIST circuit by performing a test operation comprising coupling optical signals:
through the first sacrificial optical coupler;
through the second sacrificial optical coupler;
to or from the first optoelectronic component; and
to or from the second optoelectronic component.

16. A method of forming an optical coupler system, the method comprising:
forming a transmitter component over a substrate;
forming a receiver component over the substrate;
forming a first sacrificial optical coupler in a first region over the substrate;
configuring the first sacrificial optical coupler to couple optical signals to or from the transmitter component;
configuring the first sacrificial optical coupler to couple optical signals to or from the receiver component; and
forming a v-groove in the first region over the substrate;
wherein forming the v-groove in the first region includes removing the first sacrificial optical coupler from the first region.

17. The method of claim 16 further comprising:
forming a second sacrificial optical coupler in a second region over the substrate;
configuring the second sacrificial optical coupler to couple optical signals to or from the transmitter component; and
forming a v-groove in the second region over the substrate;
wherein forming the v-groove in the second region includes removing the second sacrificial optical coupler from the second region.

18. The method of claim 17, wherein:
the first sacrificial optical coupler comprises a sacrificial waveguide system; and
the second sacrificial optical coupler comprises a sacrificial gratings system.

19. The method of claim 16 further comprising performing a test operation comprising:
coupling optical signals through the first sacrificial optical coupler to or from the transmitter component; and
coupling optical signals through the first sacrificial optical coupler to or from the receiver component.

20. The method of claim 17 further comprising performing a test operation comprising:
coupling optical signals through the second sacrificial optical coupler to or from the transmitter component;
coupling optical signals through the first sacrificial optical coupler to or from the transmitter component; and
coupling optical signals through the first sacrificial optical coupler to or from the receiver component.

21. The method of claim 16 further comprising:
forming a built-in-self-test (BIST) circuit over the substrate;
communicatively coupling the BIST circuit to the transmitter component and the receiver component; and
testing functionality of the BIST circuit by performing a test operation comprising coupling optical signals:
through the first sacrificial optical coupler;
to or from the transmitter component; and
to or from the receiver component.

22. The method of claim 17 further comprising:
forming a built-in-self-test (BIST) circuit over the substrate;
communicatively coupling the BIST circuit to the transmitter component and the receiver component; and
testing functionality of the BIST circuit by performing a test operation comprising coupling optical signals:
through the first sacrificial optical coupler;
through the second sacrificial optical coupler;
to or from the transmitter component; and
to or from the receiver component.

23. An optical coupler system comprising:
a first optoelectronic component formed over a substrate;
a sacrificial optical coupler formed in a first region over the substrate;
wherein the sacrificial optical coupler is configured to couple optical signals to or from the first optoelectronic component;
wherein the first region defines an area in which a v-groove will be formed during a subsequent fabrication operation of the optical coupler system;
a second optoelectronic component formed over the substrate; and
a built-in-self test (BIST) circuit formed over the substrate;
wherein the sacrificial optical coupler is configured to couple optical signals to or from the second optoelectronic component;
wherein the BIST circuit is communicatively coupled to the first optoelectronic component and the second optoelectronic component;
wherein the BIST circuit is configured to perform a test operation comprising coupling optical signals:
through the sacrificial optical coupler;
to or from the first optoelectronic component; and
to or from the second optoelectronic component.

24. The system of claim 23, wherein the sacrificial optical coupler comprises a sacrificial waveguide.

* * * * *